United States Patent
Cui et al.

(10) Patent No.: US 11,062,921 B1
(45) Date of Patent: Jul. 13, 2021

(54) SYSTEMS AND METHODS FOR ALUMINUM-CONTAINING FILM REMOVAL

(71) Applicant: Applied Materials, Inc., Santa Clara, CA (US)

(72) Inventors: Zhenjiang Cui, San Jose, CA (US); Anchuan Wang, San Jose, CA (US); Rohan Puligoru Reddy, San Jose, CA (US); Xiaolin Chen, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/018,229

(22) Filed: Sep. 11, 2020

(51) Int. Cl.
*H01L 21/67* (2006.01)
*H01L 21/311* (2006.01)

(52) U.S. Cl.
CPC .. *H01L 21/67069* (2013.01); *H01L 21/31122* (2013.01)

(58) Field of Classification Search
None
See application file for complete search history.

(56) References Cited

U.S. PATENT DOCUMENTS

2017/0365478 A1* 12/2017 George .................... C23F 1/12

* cited by examiner

*Primary Examiner* — Roberts P Culbert
(74) *Attorney, Agent, or Firm* — Kilpatrick Townsend & Stockton LLP

(57) ABSTRACT

Exemplary etching methods may include flowing a halogen-containing precursor into a substrate processing region of a semiconductor processing chamber. The halogen-containing precursor may be characterized by a gas density greater than or about 5 g/L. The methods may include contacting a substrate housed in the substrate processing region with the halogen-containing precursor. The substrate may define an exposed region of an aluminum-containing material. The contacting may produce an aluminum halide material. The methods may include flowing an etchant precursor into the substrate processing region. The methods may include contacting the aluminum halide material with the etchant precursor. The methods may include removing the aluminum halide material.

20 Claims, 5 Drawing Sheets

SYSTEMS AND METHODS FOR ALUMINUM-CONTAINING FILM REMOVAL

TECHNICAL FIELD

The present technology relates to semiconductor processes and equipment. More specifically, the present technology relates to selectively etching aluminum-containing structures.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. For example, a wet etch may preferentially remove some oxide dielectrics over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary etching methods may include flowing a halogen-containing precursor into a substrate processing region of a semiconductor processing chamber. The halogen-containing precursor may be characterized by a gas density greater than or about 5 g/L. The methods may include contacting a substrate housed in the substrate processing region with the halogen-containing precursor. The substrate may define an exposed region of an aluminum-containing material. The contacting may produce an aluminum halide material. The methods may include flowing an etchant precursor into the substrate processing region. The methods may include contacting the aluminum halide material with the etchant precursor. The methods may include removing the aluminum halide material.

In some embodiments, the halogen-containing precursor may include a transition metal, and the etchant precursor may be or include a chlorine-containing precursor. The halogen-containing precursor may include tungsten or niobium. The aluminum-containing material may be or include aluminum oxide. The etching method may be a plasma-free etching process. The etching method may be performed at a temperature greater than or about 300° C. The etching method may be performed at a pressure greater than or about 0.1 Torr. The etching method may be performed at a pressure less than or about 50 Torr. The methods may include a pre-treatment performed prior to flowing the halogen-containing precursor. The pre-treatment may include contacting the substrate with a plasma comprising one or more of oxygen, hydrogen, or nitrogen. The methods may include a post-treatment performed subsequent the etching method. The post-treatment may include contacting the substrate with a plasma comprising one or more of oxygen, hydrogen, or nitrogen.

Some embodiments of the present technology may encompass etching methods. The methods may include forming a plasma of a treatment precursor including one or more of oxygen, hydrogen, or nitrogen to produce treatment plasma effluents. The methods may include flowing the treatment plasma effluents into a substrate processing region of a semiconductor processing chamber. The methods may include contacting a substrate housed in the substrate processing region with the treatment plasma effluents. The substrate may define an exposed region of an aluminum-containing material. The treatment plasma effluents may be configured to remove a residue from a surface of the aluminum-containing material. The methods may include flowing a first halogen-containing material into the substrate processing region of the semiconductor processing chamber. The methods may include contacting the substrate with the first halogen-containing material. The methods may include flowing a second halogen-containing precursor into the substrate processing region of the semiconductor processing chamber. The methods may include removing the aluminum-containing material.

In some embodiments, the first halogen-containing material may include tungsten or niobium or plasma effluents of a fluorine-containing precursor. The second halogen-containing precursor may be or include boron trichloride. The methods may include halting the plasma formation prior to flowing the first halogen-containing material. The etching method may be performed at a temperature greater than or about 300° C. The etching method may be performed at a pressure greater than or about 0.1 Torr. The methods may include a post-treatment performed subsequent the etching method. The post-treatment may include contacting the substrate with a plasma comprising one or more of oxygen, hydrogen, or nitrogen.

Some embodiments of the present technology may encompass etching methods. The methods may include flowing a fluorine-containing precursor into a substrate processing region of a semiconductor processing chamber. The fluorine-containing precursor may be characterized by a gas density greater than or about 5 g/L. The methods may include contacting a substrate housed in the substrate processing region with the fluorine-containing precursor. The substrate may define an exposed region of an aluminum-containing material. The methods may include flowing a chlorine-containing precursor into the substrate processing region of the semiconductor processing chamber. The methods may include contacting the substrate with the chlorine-containing precursor. The methods may include removing the aluminum-containing material. The methods may include forming a plasma of a treatment precursor including one or more of oxygen, hydrogen, or nitrogen to produce treatment plasma effluents. The methods may include contacting the substrate with the treatment plasma effluents.

In some embodiments, the fluorine-containing precursor may include tungsten or niobium, and the chlorine-containing precursor may include boron. The treatment plasma effluents may be configured to remove residual tungsten or niobium from one or more of the substrate or the semiconductor processing chamber. The etching method may be performed at a temperature greater than or about 300° C. and at a pressure greater than or about 0.1 Torr.

Such technology may provide numerous benefits over conventional systems and techniques. For example, the processes may allow dry etching to be performed that may protect features of the substrate. Additionally, the processes may selectively remove aluminum-containing films relative to other exposed materials on the substrate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
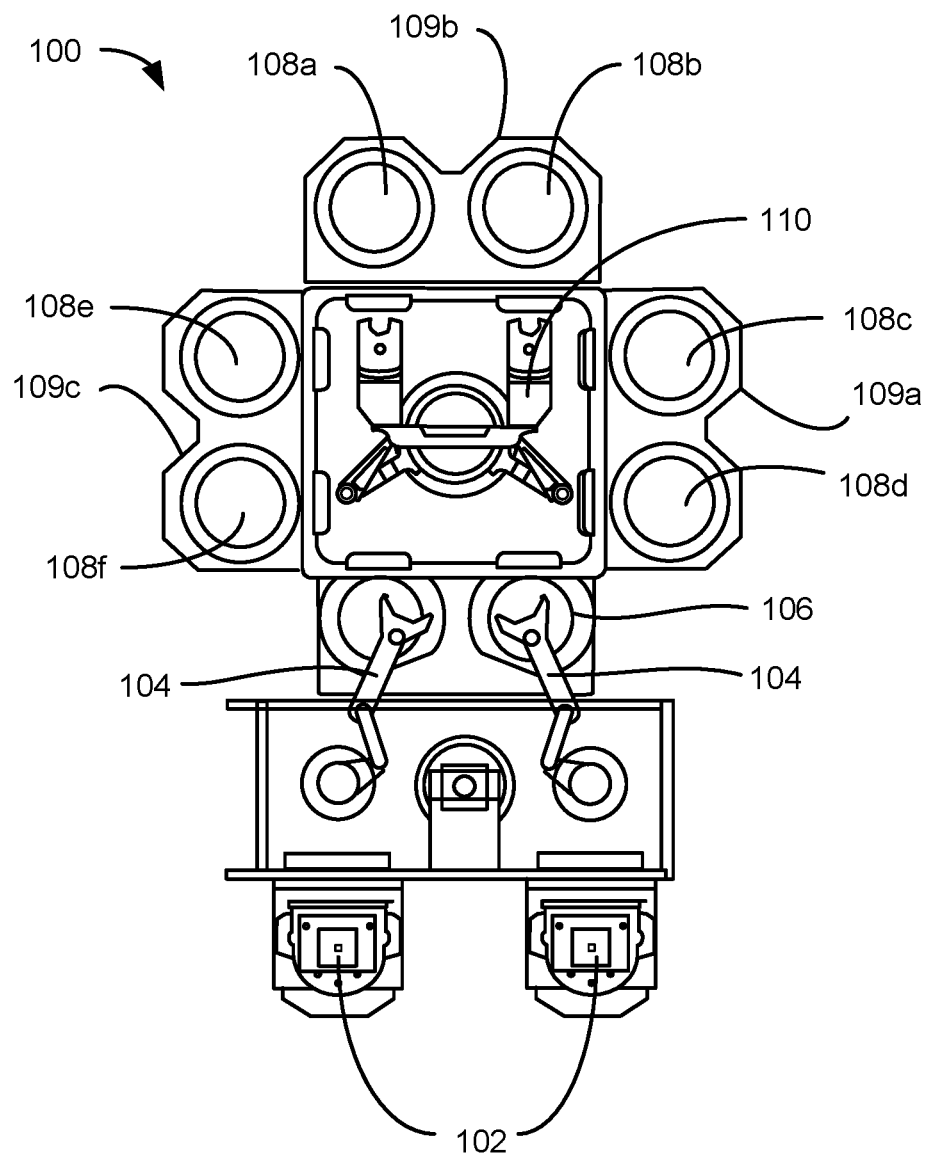
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include additional or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Diluted acids may be used in many different semiconductor processes for cleaning substrates and removing materials from those substrates. For example, diluted hydrofluoric acid can be an effective etchant for silicon oxide, aluminum oxide, and other materials, and may be used to remove these materials from substrate surfaces. After the etching or cleaning operation is complete, the acid may be dried from the wafer or substrate surface. Using dilute hydrofluoric acid ("DHF") may be termed a "wet" etch, and the diluent is often water. Additional etching processes may be used that utilize precursors delivered to the substrate. For example, plasma enhanced processes may also selectively etch materials by enhancing precursors through the plasma to perform a dry etch.

Although wet etchants using aqueous solutions or water-based processes may operate effectively for certain substrate structures, the water may pose challenges in a variety of conditions. For example, utilizing water during etch processes may cause issues when disposed on substrates including metal materials. For example, certain later fabrication processes, such as recessing gaps, removing oxide dielectric, or other processes to remove oxygen-containing materials, may be performed after an amount of metallization has been formed on a substrate. If water is utilized in some fashion during the etching, an electrolyte may be produced, which when contacting the metal material, may cause galvanic corrosion to occur between dissimilar metals, and the metal may be corroded or displaced in various processes. In addition, because of the surface tension of the water diluent, pattern deformation and collapse may occur with minute structures. The water-based material may also be incapable of penetrating some high aspect ratio features due to surface tension effects.

Plasma etching may overcome the issues associated with water-based etching, although additional issues may occur. For example, aluminum oxide and other aluminum-based dielectrics have been incorporated in many semiconductor structures, and exhibit dielectric properties. Because of the dielectric nature, these aluminum materials do not readily conduct electricity. Accordingly, when charged plasma species are flowed towards these materials, charge buildup may occur along the surface of the aluminum-based dielectric. Once accumulation has surpassed a threshold, the electrical voltage may cause breakdown, which can damage the aluminum material.

The present technology overcomes these issues by performing a dry etch process that may passivate a number of materials relative to a material to be etched, and in some embodiments a process may be plasma free during the etching. By utilizing particular precursors that may facilitate halogen dissociation to provide etchant materials, an etch process may be performed that may protect the surrounding structures. Additionally, the materials and conditions used may allow improved etching relative to conventional techniques.

Although the remaining disclosure will routinely identify specific etching processes utilizing the disclosed technology, it will be readily understood that the systems and methods are equally applicable to deposition and cleaning processes as may occur in the described chambers, as well as other etching technology including mid and back-end-of-line processing and other etching that may be performed with a variety of exposed materials that may be maintained or substantially maintained. Accordingly, the technology should not be considered to be so limited as for use with the exemplary etching processes or chambers alone. Moreover, although an exemplary chamber is described to provide foundation for the present technology, it is to be understood that the present technology can be applied to virtually any semiconductor processing chamber that may allow the operations described.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108*a-f* may include one or more system components for depositing, annealing, curing and/or etching a dielectric film on the substrate wafer. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
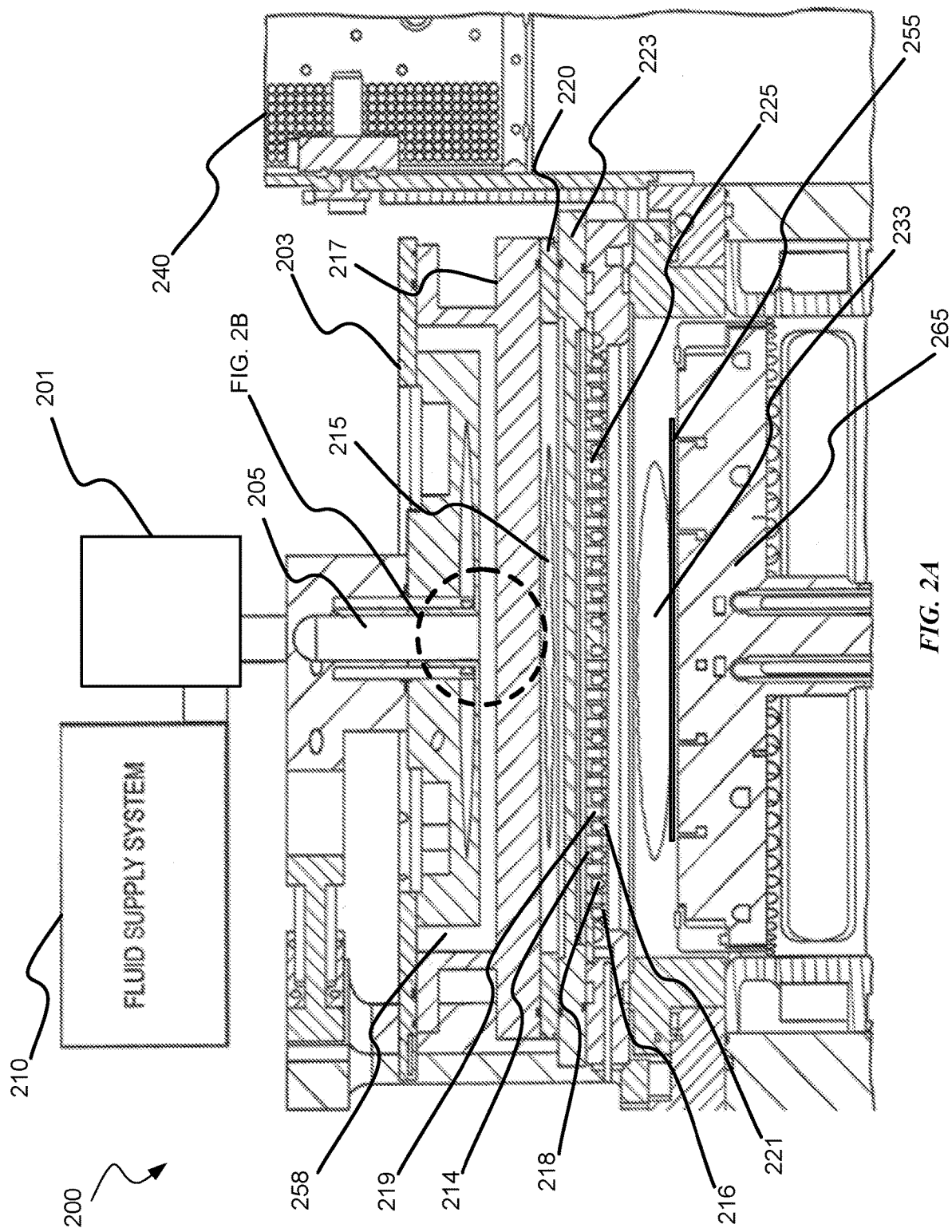
FIG. 2A shows a schematic cross-sectional view of an exemplary processing chamber according to some embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a pedestal 265 or substrate support, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may include aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
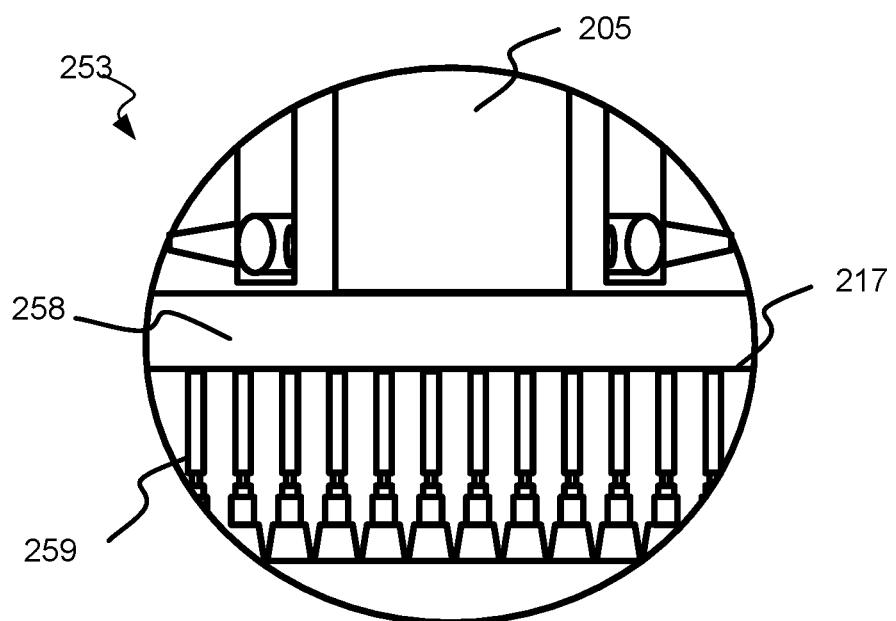
FIG. 2B shows a detailed view of a portion of the processing chamber illustrated in FIG. 2A according to some embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
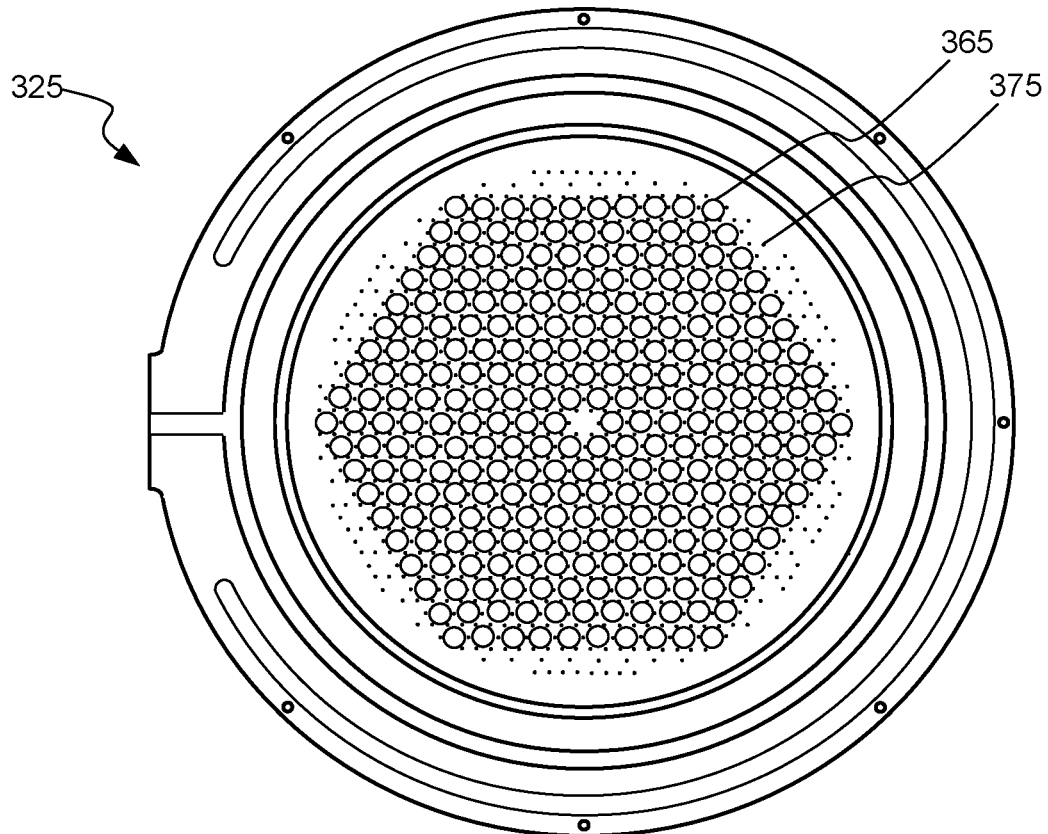
FIG. 3 shows a bottom plan view of an exemplary showerhead according to some embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the showerhead 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
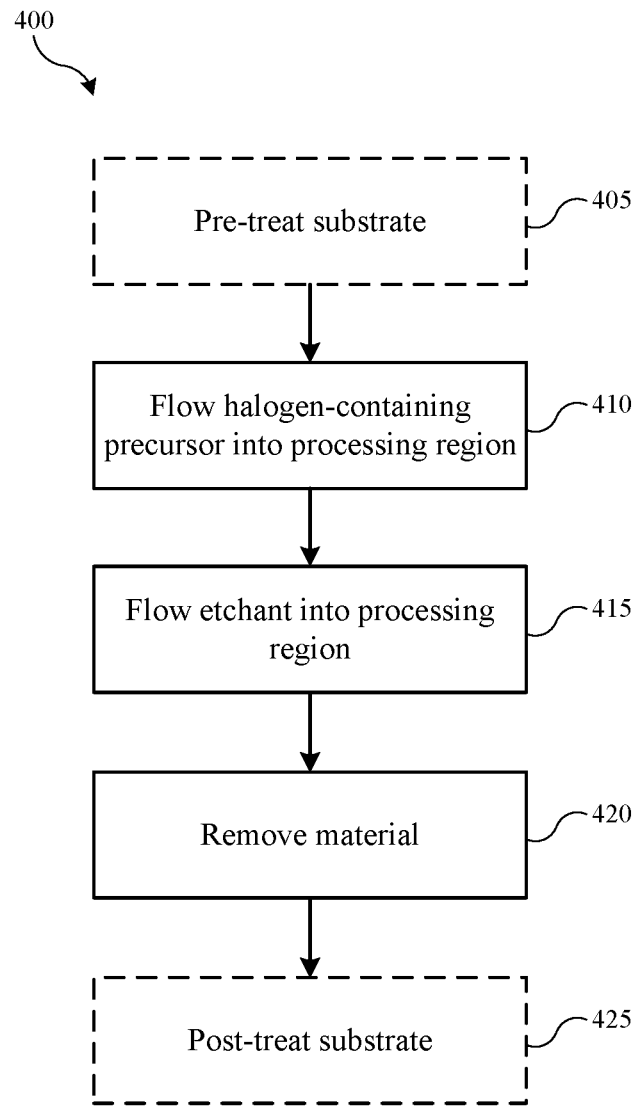
FIG. 4 shows exemplary operations in a method according to some embodiments of the present technology.

The chamber discussed previously may be used in performing exemplary methods including etching methods. Turning to FIG. 4 is shown exemplary operations in a method 400 according to embodiments of the present technology. Method 400 may include one or more operations prior to the initiation of the method, including front end processing, deposition, gate formation, etching, polishing, cleaning, or any other operations that may be performed prior to the described operations. The method may include a number of optional operations, which may or may not be specifically associated with some embodiments of methods according to the present technology. For example, many of the operations are described in order to provide a broader scope of the processes performed, but are not critical to the technology, or may be performed by alternative methodology as will be discussed further below. Method 400 may describe operations shown schematically in FIGS. 5A-5B, the illustrations of which will be described in conjunction with the operations of method 400. It is to be understood that the figures illustrate only partial schematic views, and a substrate may contain any number of additional materials and features having a variety of characteristics and aspects as illustrated in the figures.

Figure 5A:
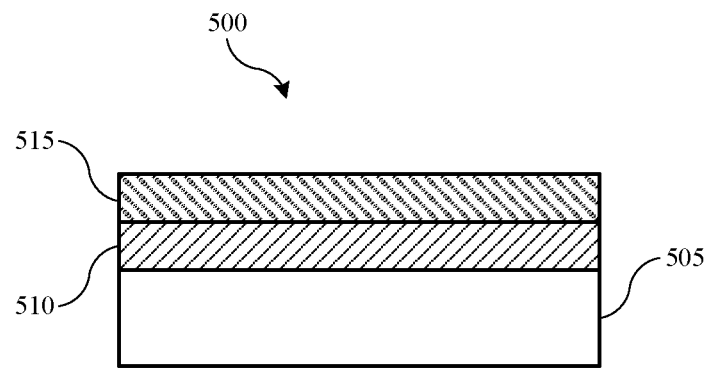
FIGS. 5A-5B show schematic cross-sectional views of materials etched according to some embodiments of the present technology.

Method 400 may or may not involve optional operations to develop the semiconductor structure to a particular fabrication operation. It is to be understood that method 400 may be performed on any number of semiconductor structures or substrates 505, as illustrated in FIG. 5A, including exemplary structures on which an oxide removal operation may be performed. Exemplary semiconductor structures may include a trench, via, or other recessed features that may include one or more exposed materials. For example, an exemplary substrate may contain silicon or some other semiconductor substrate material as well as interlayer dielectric materials through which a recess, trench, via, or isolation structure may be formed. Exposed materials at any time during the etch process may be or include metal materials such as for a gate, a dielectric material, a contact material, a transistor material, or any other material that may be used in semiconductor processes. In some embodiments exemplary substrates may include an aluminum-containing material 515, such as aluminum oxide, or some other aluminum-containing dielectric. The aluminum-containing material may be exposed relative to one or more other materials 510 including metals, other dielectrics including silicon oxide or nitride, or any of a number of other semiconductor materials relative to which the aluminum-containing material is to be removed, such as a nitride of titanium, tantalum, or other materials.

It is to be understood that the noted structure is not intended to be limiting, and any of a variety of other semiconductor structures including aluminum-containing materials are similarly encompassed. Other exemplary structures may include two-dimensional and three-dimensional structures common in semiconductor manufacturing, and within which an aluminum-containing material such as aluminum oxide is to be removed relative to one or more other materials, as the present technology may selectively remove aluminum-containing materials relative to other exposed materials, such as silicon-containing materials, and any of the other materials discussed elsewhere. Additionally, although a high-aspect-ratio structure may benefit from the present technology, the technology may be equally applicable to lower aspect ratios and any other structures.

For example, layers of material according to the present technology may be characterized by any aspect ratios or the height-to-width ratio of the structure, although in some embodiments the materials may be characterized by larger aspect ratios, which may not allow sufficient etching utilizing conventional technology or methodology. For example, in some embodiments the aspect ratio of any layer of an exemplary structure may be greater than or about 10:1, greater than or about 20:1, greater than or about 30:1, greater than or about 40:1, greater than or about 50:1, or greater. Additionally, each layer may be characterized by a reduced width or thickness less than or about 100 nm, less than or about 80 nm, less than or about 60 nm, less than or about 50 nm, less than or about 40 nm, less than or about 30 nm, less than or about 20 nm, less than or about 10 nm, less than or about 5 nm, less than or about 1 nm, or less, including any fraction of any of the stated numbers, such as 20.5 nm, 1.5 nm, etc. This combination of high aspect ratios and minimal thicknesses may frustrate many conventional etching operations, or require substantially longer etch times to remove a layer, along a vertical or horizontal distance through a confined width. Moreover, damage to or removal of other exposed layers may occur with conventional technologies as well.

Method 400 may be performed to remove an exposed aluminum-containing material in embodiments, although any number of oxide or aluminum-containing materials may be removed in any number of structures in embodiments of the present technology. The methods may include specific operations for the removal of aluminum-containing materials, and may include one or more optional operations to prepare or treat the aluminum-containing materials. For example, an exemplary substrate structure may have previous processing residues on a film to be removed, such as aluminum oxide. For example, residual photoresist or byproducts from previous processing may reside on the aluminum oxide layer. These materials may prevent access to the aluminum oxide, or may interact with etchants differently than a clean aluminum oxide surface, which may frustrate one or more aspects of the etching. Accordingly, in some embodiments an optional pre-treatment of the aluminum-containing film or material may occur at optional operation 405. Exemplary pre-treatment operations may include a thermal treatment, wet treatment, or plasma treatment, for example, which may be performed in chamber 200 as well as any number of chambers that may be included on system 100 described above.

In one exemplary plasma treatment, a remote or local plasma may be developed from a precursor intended to interact with residues in one or more ways. For example, utilizing chambers such as chamber 200 described above, either a remote or local plasma may be produced from one or more precursors. For example, an oxygen-containing precursor, a hydrogen-containing precursor, a nitrogen-containing precursor, a helium-containing precursor, or some other precursor may be flowed into a remote plasma region or into the processing region, where a plasma may be struck. The plasma effluents may be flowed to the substrate, and may contact the residue material. The plasma process may be either physical or chemical depending on the material to be removed to expose the aluminum-containing material. For example, plasma effluents may be flowed to contact and physically remove the residue, such as by a sputtering operation, or the precursors may be flowed to interact with the residues to produce volatile byproducts that may be removed from the chamber.

Exemplary precursors used in the pre-treatment may be or include hydrogen, a hydrocarbon, water vapor, an alcohol, hydrogen peroxide, or other materials that may include hydrogen as would be understood by the skilled artisan. Exemplary oxygen-containing precursors may include molecular oxygen, ozone, nitrous oxide, nitric oxide, or other oxygen-containing materials. Nitrogen gas may also be used, or a combination precursor having one or more of hydrogen, oxygen, and/or nitrogen may be utilized to remove particular residues. Once the residue or byproducts have been removed, a clean aluminum-oxide surface may be exposed for etching.

Method 400 may include flowing a halogen-containing precursor, including a first halogen-containing precursor, into the substrate processing region of a semiconductor processing chamber housing the described substrate, or some other substrate, at operation 410. The halogen-containing precursor may be flowed through a remote plasma region of the processing chamber, such as region 215 described above, although in some embodiments method 400 may not utilize plasma effluents during the etching operations. For example, method 400 may flow a fluorine-containing or other halogen-containing precursor to the substrate without exposing the precursor to a plasma, and may perform the removal of the aluminum-containing material without production of plasma effluents. In some embodiments the halogen-containing precursor may be plasma enhanced, which may occur in a remote plasma region to protect materials on the substrate from contact with plasma effluents. The halogen-containing precursor may contact a semiconductor substrate including an exposed aluminum-containing material, and may produce a fluorinated material, such as aluminum fluoride or an aluminum halide material, which may remain on the semiconductor substrate. The halogen-containing precursor may donate one or more fluorine atoms, while accepting one or more oxygen atoms in some embodiments. Some halogen-containing precursors, such as plasma enhanced precursors, may provide fluorine radicals, while other plasma radicals may accept oxygen from the film.

Figure 5B:
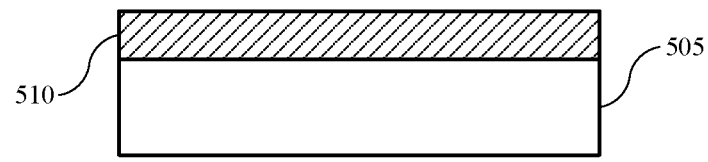

Subsequent the fluorination operation, an etchant precursor may be flowed into the processing region at operation 415. In some embodiments, the etchant precursor may be a second halogen-containing precursor, and may include the same or a different halogen as the first halogen-containing precursor. The etchant precursor may further substitute to produce an aluminum byproduct that may be volatile under processing conditions, and may be evolved from the substrate. Accordingly, the etchant precursor may etch or remove the aluminum material at operation 420, as shown in FIG. 5B.

As noted above, the present technology may be performed without plasma development during the etching operations 410-420. By utilizing particular precursors, and performing the etching within certain process conditions, a plasma-free removal may be performed, and the removal may also be a dry etch. Accordingly, techniques according to aspects of the present technology may be performed to remove aluminum oxide from narrow features, as well as high aspect ratio features, and thin dimensions that may otherwise be unsuitable for wet etching. An optional operation may be performed to clear the substrate or chamber of residues and may include a post-treatment at optional operation 425. The post-treatment may include similar operations as the pre-treatment, and may include any of the precursors or operations discussed above for the pre-treatment. The post-treatment may clear residual transition metal from the substrate or chamber in some embodiments. It is to be understood that although the pre-treatment and/or post-treatment operations may include plasma generation and plasma effluent delivery to the substrate, plasma may not be formed during the etching operations. For example, in some embodiments no plasma may be generated while the halogen-containing precursor or precursors are being delivered into the processing chamber. Additionally, in some embodiments, the etching precursors may be hydrogen-free in some embodiments, and the etching method may not include hydrogen-containing precursors during the etching, although hydrogen-containing precursors may be used during either or both of the optional pre-treatment or post-treatment operations.

The precursors during each of the two-step operation may include halogen-containing precursors, and may include one or more of fluorine or chlorine in some embodiments. The specific precursors may be based on bonding or stability of the precursors. For example, in some embodiments the first halogen-containing precursor may include a transition metal and/or may be characterized by a particular gas density. The transition metal may include any transition metal which may be capable of bonding with halogens, and which may dissociate under operating conditions as discussed below. Exemplary transition metals may include tungsten, niobium, or any other materials, and may include transition-metal-and-halogen-containing precursors characterized by a gas density greater than or about 3 g/L, and may be characterized by a gas density of greater than or about 4 g/L, greater than or about 5 g/L, greater than or about 6 g/L, greater than or about 7 g/L, greater than or about 8 g/L, greater than or about 9 g/L, greater than or about 10 g/L, greater than or about 11 g/L, greater than or about 12 g/L, greater than or about 13 g/L, or higher.

These precursors may be characterized by relatively high thermal and chemical stability because of the nature of bonding between the heavy metal and the halogen. The precursors may also be characterized by a transition metal characterized by relatively low resistivity, which may further facilitate bonding stability at lower temperatures, and facile dissociation at elevated temperatures. Accordingly, the materials may be characterized by a resistivity of less than or about 50 µΩ·cm, and may be characterized by a resistivity of less than or about 40 µΩ·cm, less than or about 30 µΩ·cm, less than or about 20 µΩ·cm, less than or about 15 µΩ·cm, less than or about 10 µΩ·cm, less than or about 5 µΩ·cm, or less. The precursors may also include any number of carrier gases, which may include nitrogen, helium, argon, or other noble, inert, or useful precursors.

Some exemplary precursors that may include the stated characteristics may include tungsten hexafluoride, tungsten pentachloride, niobium tetrachloride, or other transition metal halides, as well as other halides including hydrogen fluoride, nitrogen trifluoride, or any organofluoride. The precursors may also be flown together in a variety of combinations. In some embodiments, nitrogen trifluoride, or some other fluorine-containing precursor may be delivered to a remote plasma region with hydrogen and plasma enhanced to produce a fluorinated surface of aluminum in the first operation. Etchant precursors according to some embodiments of the present technology may specifically include heavy metal halides, which may be characterized by stability at atmospheric conditions, with relatively facile dissociation at increased temperature. For example, exemplary precursors may be characterized by relatively weak bonding at elevated temperatures, which may allow controlled exposure of aluminum oxide to halogen etchants.

As a non-limiting example, tungsten hexafluoride may readily donate a fluorine atom or two at elevated temperatures, and accept an oxygen atom, such as from the aluminum oxide, and be maintained in a gas phase. Accordingly, tungsten oxide fluorides may be developed as reaction byproducts, which may be gas molecules and may be pumped or removed from the processing chamber. Because aluminum fluoride may not be volatile, a chlorine-containing precursor, bromine-containing precursor, or iodine-containing precursor, any of which may include boron, titanium, tin, molybdenum, tungsten, or niobium, may be used to donate chlorine, bromine, or iodine, and accept fluorine at the same temperatures. While chlorine, bromine, or iodine may not readily be donated relative to aluminum oxide, the materials may be donated to aluminum fluoride while the etchant precursor may accept the fluorine producing two volatile components, including aluminum chloride, which may be exhausted from the processing chamber. Accordingly, the process may remove aluminum oxide under processing conditions configured to exchange fluorine and oxygen between the etchant and the exposed surface, followed by an exchange of fluorine for chlorine, and produce volatile aluminum byproducts, and maintain a majority of the tungsten and etchant precursor in vapor form. Accordingly, tungsten and other heavy metals similarly encompassed by the present technology may have limited or essentially no interaction with the process, while delivering halogens to the materials to be etched. Because of the controlled delivery, tungsten oxide and other metal halides may not etch or may minimally interact with other exposed surfaces, while readily removing aluminum oxide, which may produce enhanced selectivity over conventional techniques.

Processing conditions may impact and facilitate etching according to the present technology. Because the etch reaction may proceed based on thermal dissociation of halogen from the transition metals, the temperatures may be at least partially dependent on the particular halogen and/or transition metal of the precursor in order to initiate dissociation. As illustrated, as temperature increases above or about 300° C., etching begins to occur or increase, which may indicate dissociation of the precursor, and/or activation of the reaction with aluminum oxide. As temperature continues to increase, dissociation may be further facilitated as may the reaction with aluminum oxide.

Accordingly, in some embodiments of the present technology, etching methods may be performed at substrate, pedestal, and/or chamber temperatures above or about 300° C., and may be performed at temperatures above or about 350° C., above or about 400° C., above or about 450° C., above or about 500° C., or higher. The temperature may also be maintained at any temperature within these ranges, within smaller ranges encompassed by these ranges, or between any of these ranges. In some embodiments the method may be performed on substrates that may have a number of produced features, which may produce a thermal budget. Accordingly, in some embodiments, the methods may be performed at temperatures below or about 800° C., and may be performed at temperatures below or about 750° C., below or about 700° C., below or about 650° C., below or about 600° C., below or about 550° C., below or about 500° C., or lower.

The pressure within the chamber may also affect the operations performed as well as affect at what temperature the halogen may dissociate from the transition metal. Accordingly, in some embodiments the pressure may be maintained below about 50 Torr, below or about 40 Torr, below or about 30 Torr, below or about 25 Torr, below or about 20 Torr, below or about 15 Torr, below or about 10 Torr, below or about 9 Torr, below or about 8 Torr, below or about 7 Torr, below or about 6 Torr, below or about 5 Torr, below or about 4 Torr, below or about 3 Torr, below or about 2 Torr, below or about 1 Torr, below or about 0.1 Torr, or less. The pressure may also be maintained at any pressure within these ranges, within smaller ranges encompassed by these ranges, or between any of these ranges. In some embodiments, etch amount may be facilitated and may initiate as pressure increases above about 1 Torr. Additionally, as pressure continues to increase, etching may improve up to a point before beginning to reduce, and eventually cease as pressure continues to increase.

Without being bound to any particular theory, pressure within the chamber may affect processing with precursors described above. At low pressures, flow across a substrate may be reduced, and dissociation may similarly be reduced. As pressure increases, interactions between the etchant precursor and the substrate may increase, which may increase reactions and etch rates. However, as pressure continues to increase, recombination of the dissociated halogen atoms with the heavy metal base may increase due to the relative stability of the molecules. Thus, the precursors may effectively be pumped back out of the chamber without reacting with the substrate. Additionally, interactions with the aluminum oxide surface may be suppressed as pressure continues to increase, or byproduct aluminum fluoride may be reintroduced to the film being etched, further limiting removal. Accordingly, in some embodiments, pressure within the processing chamber may be maintained below or about 10 Torr in some embodiments.

Flow rates of the halogen-containing precursor may be tuned, including in situ, to control the etch process. For example, a flow rate of the halogen-containing precursor may be reduced, maintained, or increased during the removal operations. By increasing the flow rate of the halogen-containing precursor, etch rates may be increased up to a point of saturation. During any of the operations of method 400, the flow rate of the fluorine-containing precursor may be between about 5 sccm and about 1,000 sccm. Additionally, the flow rate of the halogen-containing precursor may be maintained below or about 900 sccm, below or about 800 sccm, below or about 700 sccm, below or about 600 sccm, below or about 500 sccm, below or about 400 sccm, below or about 300 sccm, below or about 200 sccm, below or about 100 sccm, or less. The flow rate may also be between any of these stated flow rates, or within smaller ranges encompassed by any of these numbers.

Adding further control to the etch process, the halogen-containing precursor may be pulsed in some embodiments, and may be delivered throughout the etch process either continually or in a series of pulses, which may be consistent or varying over time. The pulsed delivery may be characterized by a first period of time during which the halogen-containing precursor is flowed, and a second period of time during which the halogen-containing precursor is paused or halted. The time periods for any pulsing operation may be similar or different from one another with either time period being longer. In embodiments either period of time or a continuous flow of precursor may be performed for a time period greater than or about 1 second, and may be greater than or about 2 seconds, greater than or about 3 seconds, greater than or about 4 seconds, greater than or about 5 seconds, greater than or about 6 seconds, greater than or about 7 seconds, greater than or about 8 seconds, greater than or about 9 seconds, greater than or about 10 seconds, greater than or about 11 seconds, greater than or about 12 seconds, greater than or about 13 seconds, greater than or about 14 seconds, greater than or about 15 seconds, greater than or about 20 seconds, greater than or about 30 seconds, greater than or about 45 seconds, greater than or about 60 seconds, or longer. The times may also be any smaller range encompassed by any of these ranges. In some embodiments as delivery of the precursor occurs for longer periods of time, etch rate may increase.

By performing operations according to embodiments of the present technology, aluminum oxide or other aluminum-containing materials may be etched selectively relative to other materials, including other oxides. For example, the present technology may selectively etch aluminum oxide relative to exposed regions of metals, dielectrics including silicon-containing materials including silicon oxide, or other materials. Embodiments of the present technology may etch aluminum oxide relative to silicon oxide or any of the other materials at a rate of at least about 20:1, and may etch aluminum oxide relative to silicon oxide or other materials noted at a selectivity greater than or about 25:1, greater than or about 30:1, greater than or about 50:1, greater than or about 100:1, greater than or about 150:1, greater than or about 200:1, greater than or about 250:1, greater than or about 300:1, greater than or about 350:1, greater than or about 400:1, greater than or about 450:1, greater than or about 500:1, or more. For example, etching performed according to some embodiments of the present technology may etch aluminum oxide while substantially or essentially maintaining silicon oxide or other materials, such as nitrides of silicon, titanium, tantalum, or other materials.

Selectivity may be based in part on precursors used, and the ability to dissociate at more controlled temperature ranges. For example, conventional precursors, including nitrogen trifluoride, may not as readily dissociate at temperatures below or about 500° C. at operating pressures, and may also be characterized by a slower reaction rate with the material to be removed, which may increase the exposure time of other materials on a substrate, and which may increase removal of these materials. Accordingly, conventional dry etchants may be incapable of producing etch selectivities of embodiments of the present technology. Similarly, because wet etchants readily remove silicon oxide, wet etchants may also be incapable of etching selectively at rates comparable to embodiments of the present technology.

The previously discussed methods may allow the removal of aluminum-containing materials relative to a number of other exposed materials. By utilizing transition metals as described previously, improved etching of aluminum oxide may be performed, which may both increase selectivity over conventional techniques, as well as improve etching access in small pitch features.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An etching method comprising:
flowing a halogen-containing precursor into a substrate processing region of a semiconductor processing chamber, wherein the halogen-containing precursor is characterized by a gas density greater than or about 5 g/L;
contacting a substrate housed in the substrate processing region with the halogen-containing precursor, wherein the substrate defines an exposed region of an aluminum-containing material, and wherein the contacting produces an aluminum halide material;
flowing an etchant precursor into the substrate processing region;
contacting the aluminum halide material with the etchant precursor; and
removing the aluminum halide material.

2. The etching method of claim 1, wherein the halogen-containing precursor comprises a transition metal, and wherein the etchant precursor comprises a chlorine-containing precursor.

3. The etching method of claim 2, wherein the halogen-containing precursor comprises tungsten or niobium.

4. The etching method of claim 1, wherein the aluminum-containing material comprises aluminum oxide.

5. The etching method of claim 1, wherein the etching method comprises a plasma-free etching process.

6. The etching method of claim 1, wherein the etching method is performed at a temperature greater than or about 300° C.

7. The etching method of claim 1, wherein the etching method is performed at a pressure greater than or about 0.1 Torr.

8. The etching method of claim 7, wherein the etching method is performed at a pressure less than or about 50 Torr.

9. The etching method claim 1, further comprising a pre-treatment performed prior to flowing the halogen-containing precursor, wherein the pre-treatment comprises contacting the substrate with a plasma comprising one or more of oxygen, hydrogen, or nitrogen.

10. The etching method claim 1, further comprising a post-treatment performed subsequent the etching method, wherein the post-treatment comprises contacting the substrate with a plasma comprising one or more of oxygen, hydrogen, or nitrogen.

11. An etching method comprising:
forming a plasma of a treatment precursor comprising one or more of oxygen, hydrogen, or nitrogen to produce treatment plasma effluents;
flowing the treatment plasma effluents into a substrate processing region of a semiconductor processing chamber;
contacting a substrate housed in the substrate processing region with the treatment plasma effluents, wherein the substrate defines an exposed region of an aluminum-containing material, and wherein the treatment plasma effluents are configured to remove a residue from a surface of the aluminum-containing material;
flowing a first halogen-containing material into the substrate processing region of the semiconductor processing chamber;
contacting the substrate with the first halogen-containing material;
flowing a second halogen-containing precursor into the substrate processing region of the semiconductor processing chamber; and
removing the aluminum-containing material.

12. The etching method of claim 11, wherein the first halogen-containing material comprises tungsten or niobium or plasma effluents of a fluorine-containing precursor, and wherein the second halogen-containing precursor comprises boron trichloride.

13. The etching method of claim 11, further comprising halting the plasma formation prior to flowing the first halogen-containing material.

14. The etching method of claim 11, wherein the etching method is performed at a temperature greater than or about 300° C.

15. The etching method of claim 11, wherein the etching method is performed at a pressure greater than or about 0.1 Torr.

16. The etching method of claim 11, further comprising a post-treatment performed subsequent the etching method, wherein the post-treatment comprises contacting the substrate with a plasma comprising one or more of oxygen, hydrogen, or nitrogen.

17. An etching method comprising:

flowing a fluorine-containing precursor into a substrate processing region of a semiconductor processing chamber, wherein the fluorine-containing precursor is characterized by a gas density greater than or about 5 g/L;

contacting a substrate housed in the substrate processing region with the fluorine-containing precursor, wherein the substrate defines an exposed region of an aluminum-containing material;

flowing a chlorine-containing precursor into the substrate processing region of the semiconductor processing chamber;

contacting the substrate with the chlorine-containing precursor;

removing the aluminum-containing material;

forming a plasma of a treatment precursor comprising one or more of oxygen, hydrogen, or nitrogen to produce treatment plasma effluents; and contacting the substrate with the treatment plasma effluents.

18. The etching method of claim 17, wherein the fluorine-containing precursor comprises tungsten or niobium, and wherein the chlorine-containing precursor comprises boron.

19. The etching method of claim 18, wherein the treatment plasma effluents are configured to remove residual tungsten or niobium from one or more of the substrate or the semiconductor processing chamber.

20. The etching method of claim 17, wherein the etching method is performed at a temperature greater than or about 300° C. and at a pressure greater than or about 0.1 Torr.

* * * * *